United States Patent
Satake et al.

(10) Patent No.: US 9,097,754 B2
(45) Date of Patent: Aug. 4, 2015

(54) METHOD OF MANUFACTURING MAGNETORESISTIVE ELEMENT

(71) Applicant: Hitachi High-Technologies Corporation, Minato-ku, Tokyo (JP)

(72) Inventors: Makoto Satake, Tokyo (JP); Jun Hayakawa, Hino (JP); Tsutomu Tetsuka, Kasumigaura (JP); Takeshi Shimada, Hikari (JP); Naohiro Yamamoto, Kudamatsu (JP); Atsushi Yoshida, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 27 days.

(21) Appl. No.: 13/748,665

(22) Filed: Jan. 24, 2013

(65) Prior Publication Data
US 2014/0116985 A1    May 1, 2014

(30) Foreign Application Priority Data
Oct. 31, 2012    (JP) .................................. 2012-239921

(51) Int. Cl.
| B44C 1/22 | (2006.01) |
| H01L 21/302 | (2006.01) |
| H01L 21/461 | (2006.01) |
| G01R 33/09 | (2006.01) |
| H01L 21/311 | (2006.01) |
| H01J 37/32 | (2006.01) |
| H01L 43/12 | (2006.01) |

(Continued)

(52) U.S. Cl.
CPC .............. *G01R 33/093* (2013.01); *G01R 33/09* (2013.01); *H01F 41/308* (2013.01); *H01J 37/32192* (2013.01); *H01L 21/31138* (2013.01); *H01L 43/12* (2013.01); *B82Y 25/00* (2013.01); *G11B 5/3116* (2013.01); *H01F 41/307* (2013.01); *H01J 37/32229* (2013.01); *H01L 21/3065* (2013.01)

(58) Field of Classification Search
None
See application file for complete search history.

(56) References Cited

U.S. PATENT DOCUMENTS

| 6,936,903 | B2 | 8/2005 | Anthony et al. |
| 6,947,316 | B2 * | 9/2005 | Takahashi et al. ............ 365/158 |

(Continued)

FOREIGN PATENT DOCUMENTS

| JP | 08-253881 | * | 1/1996 | ................ C23F 4/00 |
| JP | 2677321 | | 7/1997 | |
| JP | 4111274 | | 4/2008 | |

OTHER PUBLICATIONS

S. Ikeda et al., Tunnel magnetoresistance of 604% at 300K by suppression of Ta diffusion in CoFeB/MgO/CoFeB pseudo-spin-vales annealed at high temperature, Appli. Phys. Lett. 93, 082508 (2008).

(Continued)

*Primary Examiner* — Stephanie Duclair
(74) *Attorney, Agent, or Firm* — Baker Botts L.L.P.

(57) ABSTRACT

The present invention provides a method for manufacturing a magnetoresistive element having a high selection ratio of an insulating layer to a free layer. The method for manufacturing a magnetoresistive element includes the steps of preparing (left drawing, middle drawing) a substrate on which a free layer, a fixed layer disposed under a first magnetic layer, and a barrier layer that is an insulating layer disposed between the free layer and the fixed layer are formed and processing (right drawing) the free layer by plasma etching, in which an insulating layer configuring the barrier layer contains a Ta element or a Ti element.

11 Claims, 6 Drawing Sheets

(51) Int. Cl.
   *H01L 21/3065* (2006.01)
   *G11B 5/31* (2006.01)
   *B82Y 25/00* (2011.01)
   *H01F 41/30* (2006.01)

(56) References Cited

U.S. PATENT DOCUMENTS 7,576,956 B2   8/2009   Huai
8,374,025 B1 *  2/2013   Ranjan et al. ............... 365/171
2008/0112093 A1   5/2008   Sato et al.
2008/0164548 A1   7/2008   Ranjan et al.

OTHER PUBLICATIONS

Keizo Kinoshita et al., Etching Magnetic Tunnel Junction with Metal Etchers, Japanese Journal of Applied Physics 49 (2010) 08JB02.
Office Action mailed Nov. 28, 2014 in Korean Patent Application No. 10-2013-0007284.

* cited by examiner

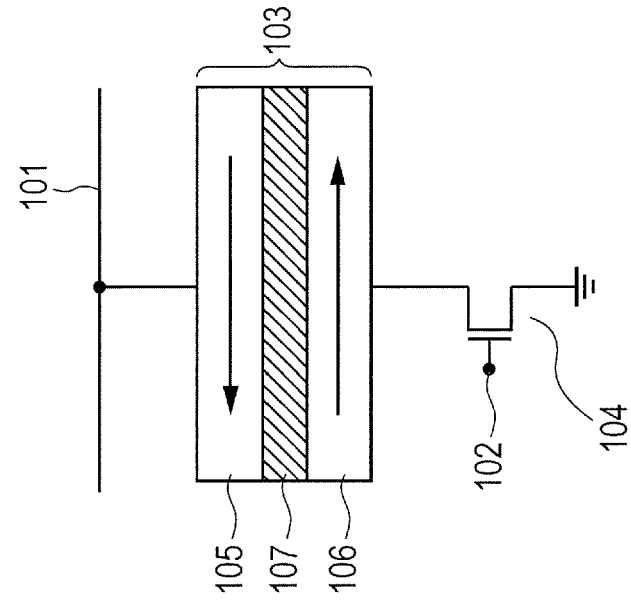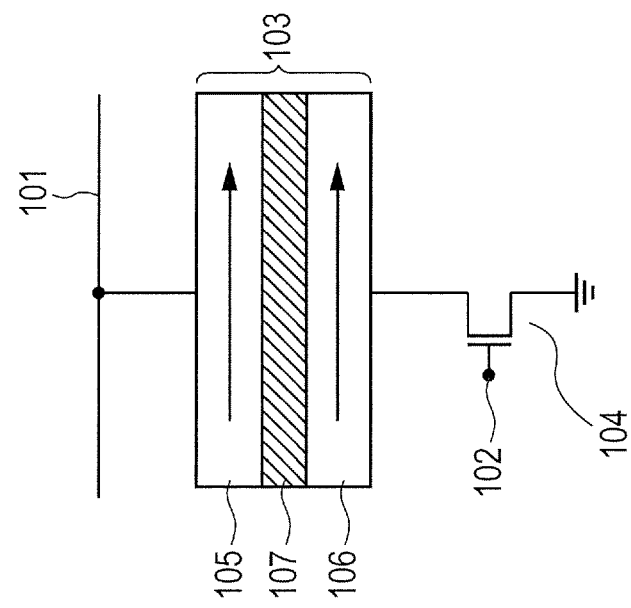

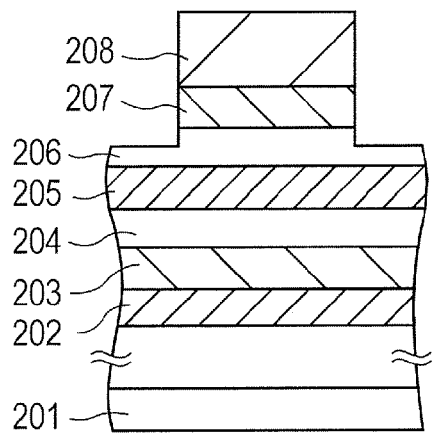
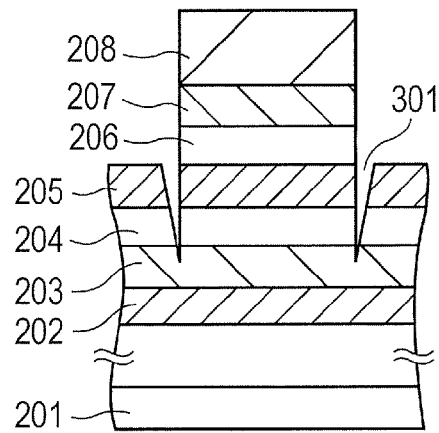
FIG. 3A    FIG. 3B
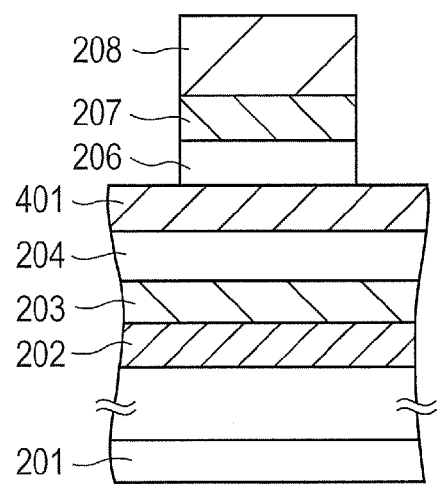
FIG. 4

METHOD OF MANUFACTURING MAGNETORESISTIVE ELEMENT

CLAIM OF PRIORITY

The present application claims priority from Japanese patent application JP2012-239921 filed on Oct. 31, 2012, the content of which is hereby incorporated by reference into this application.

FIELD OF THE INVENTION

The present invention relates to a method for manufacturing a magnetoresistive element.

BACKGROUND OF THE INVENTION

Recently, as a memory used in electronic devices, there is a demand for a non-volatile memory operated at a high speed while consuming low power. As a currently used memory, there are a dynamic random access memory (DRAM), a flash memory, and the like, that use charge accumulation. The DRAM has been used as a main memory of a computer, but is a volatile memory of which the contents are lost when a power supply is turned off. Further, rewriting needs to be performed at a predetermined interval so as to maintain data even during the operation, such that power consumption increases. Meanwhile, the flash memory is a non-volatile memory, but a writing time of information is slow on the order of μs. It is expected to use a magnetoresistive random access memory (MRAM) as a non-volatile memory that does not have the above drawbacks, consumes low power, and is operated at a high speed.

FIG. 1A illustrates a basic structure of a magnetoresistive memory. The magnetoresistive memory includes a magnetoresistive element 103 that is disposed between a bit line 101 and a word line 102, and a transistor 104 for selecting each resistive element. The magnetoresistive element 103 has a structure in which an insulating layer 107 is interposed between a free layer 105 that is a magnetic layer of which the magnetization direction can be inverted by external magnetic field or spin injection and a fixed layer 106 that is a magnetic film of which the magnetization direction is in a fixed state, and as illustrated in FIG. 1A, when the magnetization directions (arrow in the drawings) of the free layer 105 and the fixed layer 106 are parallel with each other, an electric resistance of the magnetoresistive element 103 decreases, and as illustrated in FIG. 1B, when the magnetization directions of the free layer 105 and the fixed layer 106 are antiparallel with each other, the electric resistance of the magnetoresistive element 103 increases. A memory in which a difference in electric resistance of the magnetoresistive element 103 corresponds to a 1.0 signal is a magnetoresistive memory and manufacturing of the magnetoresistive element that is a core part is important. Therefore, if the electric resistance is $R_p$ when the magnetization directions are parallel with each other and the electric resistance is $R_{ap}$ when the magnetization directions are antiparallel with each other, an element of which the magnetoresistance (MR) ratio represented by the following Equation is high has been developed.

$$MR \text{ ratio} = \frac{Rap - Rp}{Rp} \times 100(\%) \qquad \text{[Equation 1]}$$

Further, in FIG. 1A, the magnetization directions of the free layer 105 and the fixed layer 106 may horizontally face a film surface, but may vertically face the film surface. In order to increase the MR ratio, a film structure or a manufacturing method of the magnetoresistive element has been developed, and S. Ikeda et al., "Tunnel magnetoresistance of 604% at 300K by suppression of Ta diffusion in CoFeB/MgO/CoFeB pseudo spin-valves annealed at high temperature" Appl. Phys. Lett. 93 (2008) 082508 discloses a result in which the MR ratio of 604% is achieved. Further, in addition to the magnetoresistive memory, a magnetic head, a magnetic sensor, and the like, using the magnetoresistive element has been developed rapidly. In the manufacturing of the magnetoresistive element, a technology of fine processing an insulating layer made of magnetic materials including elements, such as Fe, Co, Ni, and the like, that are used for the free layer or the fixed layer or magnesium oxide (MgO), aluminum oxide (AlO), and the like, by dry etching is required. As the dry etching method, a method of using ion beam etching and a method of using plasma etching have been used. In particular, the plasma etching has been widely used for the manufacturing of the semiconductor device, and it has excellent productivity in that a large diameter substrate may be etched uniformly. In addition, the plasma etching has characteristics of improving a selection ratio for various hard mask materials by using chemical reaction.

The plasma etching is carried out by introducing process gases into a decompressed process chamber and applying high frequency power (hereinafter, referred to as source power) from a source power supply to the process chamber via a flat antenna, a coil-shaped antenna, and the like, so as to generate a plasma of the process gases and to irradiate ions or radicals generated in the plasma to a substrate. An example of the plasma source may include several types, such as an effective magnetic field microwave type, an inductively coupled plasma (ICP) type, a capacitively coupled plasma (CCP) type, and the like, according to a difference in types generating plasma. Further, in order to positively attract ions in the plasma to a wafer, there is a case in which the high frequency power (hereinafter, referred to as wafer bias power) is applied even to a stage on which the wafer is disposed. As a method of processing a magnetic film using the plasma etching, the method using a plasma of Ar gas (K. Kinoshita et al. "Etching Magnetic Tunnel Junction with Metal Etchers" Jpn. J. Appl. Phys. 49 (2010) 08JB02.), the method using a plasma of mixed gas of CO and $NH_3$ (Japanese Patent No. 02677321) and the method using a plasma of $CH_3OH$ gas (Japanese Patent No. 04111274) have been studied.

FIG. 2 illustrates an example of the method of processing a magnetoresistive element using the plasma etching. In FIG. 2, reference numeral 201 represents a Si substrate, reference numeral 202 represents an electrode film, reference numeral 203 represents an underlayer for controlling crystallinity of a fixed layer or stabilizing a magnetization of the fixed layer, reference numeral 204 represents a fixed layer, reference numeral 205 represents an insulating layer, reference numeral 206 is a free layer, reference numeral 207 represents a cap layer for protecting the free layer, reference numeral 208 represents a hard mask, and reference numeral 209 represents a resist mask. Although not illustrated in FIG. 2, transistors for selecting each resistive element or wirings for coupling each element are formed between the Si substrate 201 and the electrode film 202. Further, there is a case in which the underlayer 203 or the cap layer 207 is not present. As one of the processing methods of the magnetoresistive element, there is a method, as illustrated in the left drawing of FIG. 2, of forming each layer, etching the hard mask layer 208 and the cap layer 207 in the process (1) shown in FIG. 2, and etching only the free layer 206 in the process (2) shown in FIG. 2. In this method, it is particularly important to etch only the free layer 206 during the process of FIG. 2(2). K. Kinoshita et al. "Etching Magnetic Tunnel Junction with Metal Etchers" Jpn. J. Appl. Phys. 49 (2010) 08JB02 reports a result of etching only the free layer 206 using Ar plasma.

SUMMARY OF THE INVENTION

However, it is difficult to manufacture the magnetoresistive element exhibiting good characteristics by etching only the free layer on the overall surface of the wafer.

According to K. Kinoshita et al. "Etching Magnetic Tunnel Junction with Metal Etchers" Jpn. J. Appl. Phys. 49 (2010) 08JB02, after the process of FIG. 2(2) is performed, as illustrated in FIG. 3A, when the etching quantity of the free layer 206 is insufficient, and thus a part of the free layer 206 remains, the characteristics of the magnetoresistive element deteriorate, such that the magnetoresistive element cannot be used as an element. Further, when the etching quantity of the free layer 206 excessively increases after the process of FIG. 2(2) is performed, and thus, as illustrated in FIG. 3B, a sub trench 301 formed during the over etching penetrates through a part of the insulating layer 205 thereunder, the characteristics of the magnetoresistive element largely deteriorate. Therefore, in order to manufacture the magnetoresistive element showing good characteristics on the overall surface of the wafer, a need exists for a technology of etching only the free layer on the overall surface of the wafer.

As one of the methods of etching only the free layer on the overall surface of the wafer, there is a method of making an etching rate on the overall surface of the wafer uniform and etching only the free layer in all the elements within the wafer surface by the processing for a predetermined time. In order to achieve the method, a method for improving both in terms of process and hardware of an etching apparatus has been studied. However, it is difficult to adjust the etching rate on the overall surface of the wafer exactly the same and it is impossible to manufacture the magnetoresistive element having good characteristics in the whole of the wafer.

As another method of manufacturing a magnetoresistive element showing good characteristics on the overall surface of the wafer, there is a method in which an etching rate of an insulating layer is slower than that of the free layer so as to suppress the penetration of the insulating layer. In order to achieve the object, a method for improving of an etching process including process gases for etching has been examined.

Table 1 shows results of measuring a selection ratio of the insulating layer to the free layer according to a kind of gases by using CoFeB as a representative free layer and MgO as a representative insulating layer.

TABLE 1

| | Selection ratio of insulating layer |
|---|---|
| Ar | 1.6 |
| $NH_3$ | 0.8 |
| $CO/NH_3$ | 1.8 |
| $CH_3OH$ | 2.7 |

Further, the selection ratio of the insulating layer is defined by the following Equation and as the selection ratio of the insulating layer is increased, it is shown that the etching rate of the insulating layer is slower than the etching rate of the free layer.

Selection ratio of insulating layer=etching rate of free layer (nm/min)/etching rate of insulating layer (nm/min)   [Equation 2]

Further, each selection ratio is calculated from results of etching the free layer of CoFeB and the insulating layer of MgO by changing a kind of gases using an ICP type of plasma source under the following etching conditions. In addition, $CO/NH_3$ of Table 1 is a result when gas is introduced at a flow ratio of $CO:NH_3=1:5$.

(Etching Condition 1)

Total gas flow rate: 60 ccm, process pressure: 0.3 Pa, source power: 1200 W, wafer bias power: 500 W According to K. Kinoshita et al. "Etching Magnetic Tunnel Junction with Metal Etchers" Jpn. J. Appl. Phys. 49 (2010) 08JB02, as a result of etching the magnetoresistive element manufactured on a wafer having a diameter of 200 mm using Ar gas and therefore, a good quality of products can be obtained only in a part of the entire wafer by penetrating through the insulating layer. As a result of performing trial calculation based on a method of obtaining a good quality of products from the entire surface of a wafer having a diameter of 300 mm by using the same configuration, a selection ratio of the insulating layer using Ar gas needs to increase 3.67 times. Therefore, considering the selection ratio 1.6 of the insulating layer of an Ar process of Table 1, the selection ratio of the insulating ratio of 5.9 or more is required.

However, as shown in Table 1, the selection ratio in all kinds of gases examined is 3 or less. The process conditions such as the process pressure, the source power, the wafer bias power are examined based on etching condition 1, but the selection ratio of the insulating layer cannot be largely improved. Therefore, a new method of improving the selection ratio of the insulating layer is needed.

The present invention is directed to provide a method for manufacturing a magnetoresistive element having an etching rate of an insulating layer slower than that of a free layer (magnetic layer), that is, a high selection ratio of the insulating layer to the free layer so as to prevent a characteristic of the magnetoresistive element from deteriorating due to a penetration of a part of the insulating layer just under the free layer.

In order to solve the foregoing problems, the following technical means are considered as a method for manufacturing a magnetoresistive element according to the present invention. That is, a method for manufacturing a magnetoresistive element includes the steps of: preparing a substrate on which a first magnetic layer, a second magnetic layer disposed under the first magnetic layer, and a barrier layer that is an insulating layer disposed between the first magnetic layer and the second magnetic layer are formed; and processing the first magnetic layer by plasma etching, in which the barrier layer contains a Ta element or a Ti element.

Further, a method for manufacturing a magnetoresistive element includes the steps of: forming a second magnetic layer over a substrate; forming a barrier layer that is an insulating layer containing a Ta element or a Ti element on the second magnetic layer by sputtering an insulating material target and a Ta-containing material target or a Ti-containing material target that configure an insulating layer; forming a first magnetic layer on the barrier layer; and processing the first magnetic layer by plasma etching.

According to the present invention, it is possible to provide the method for manufacturing a magnetoresistive element having the high selection ratio of the insulating layer to the free layer.

BRIEF DESCRIPTION OF THE DRAWINGS

FIGS. 1A and 1B are schematic diagrams for describing a basic operation principle of a magnetoresistive element, in which FIG. 1A illustrates a case in which a magnetization direction of a fixed layer is the same as a magnetization direction of a free layer and FIG. 1B illustrates a case in which the magnetization directions of the fixed layer and the free layer are opposite to each other;

FIGS. 3A and 3B are schematic diagrams for describing a problem when the free layer of the magnetoresistive element is etched by the plasma etching, in which FIG. 3A illustrates a case in which the etching of the free layer is insufficient and FIG. 3B illustrates a case in which the etching of the free layer is excessive (etched up to a layer under the insulating layer);

FIG. 4 is a schematic diagram of a magnetoresistive element illustrating a state in which a free layer is etched, in a method of manufacturing a magnetoresistive element according to a first embodiment of the present invention;

DETAILED DESCRIPTION OF THE PREFERRED EMBODIMENTS

Hereinafter, embodiments of the present invention will be described with reference to the drawings.

First Embodiment

A first embodiment according to the present invention will be described with reference to FIG. 4.

Figure 2:
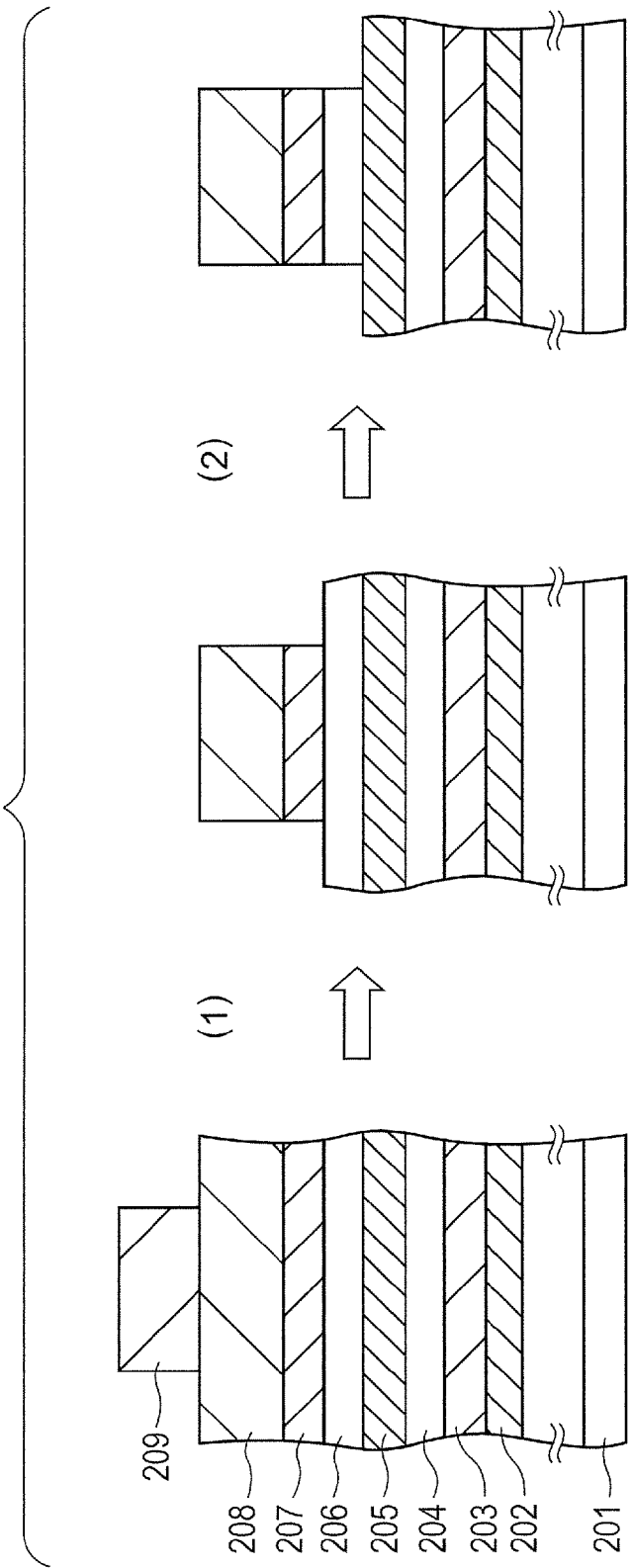
FIG. 2 is a schematic diagram illustrating a process flow of etching the free layer of the magnetoresistive element by plasma etching.

FIG. 4 illustrates a schematic diagram after a free layer of a magnetoresistive element is etched by plasma etching, in a method for manufacturing a magnetoresistive element according to a first embodiment. In FIG. 4, reference numeral 201 represents a Si substrate, reference numeral 202 represents an electrode film, reference numeral 203 represents an underlayer for controlling crystallinity of a fixed layer or stabilizing a magnetization of the fixed layer, reference numeral 204 represents a fixed layer, reference numeral 401 represents $(MgO)_{100-x}Ta_x$ that is a Ta-containing insulating layer, reference numeral 206 represents CoFeB that is a free layer, reference numeral 207 represents a cap layer for protecting the free layer, and reference numeral 208 represents a hard mask, and each layer above the electrode film 202 is sequentially formed on the substrate 201. Alternatively, the substrate on which each layer is formed may be prepared. Further, in the embodiment, as the electrode film 202, a laminated film of a Ta film having a thickness of 5 nm and a Ru film having a thickness of 10 nm is used, as the underlayer 203, a Ta layer having a thickness of 5 nm is used, as the fixed layer 204, a CoFeB layer having a thickness of 5 nm is used, as the free layer 206, a CoFeB layer having a thickness of 4 nm is used, as the cap layer 207, a laminated film of a Ta layer having a thickness of 5 nm and a Ru layer having a thickness of 5 nm is used, and as the hard mask 208, a Ta film having a thickness of 70 nm is used. Further, the thickness of the Ta-containing insulating layer 401 is set to be 2.1 nm. In addition, the processes up to FIG. 4 are basically the same as those of FIG. 2, but are different from those of FIG. 2, in terms of compositions of the insulating layer 205 or a method for forming the insulating layer 205. The magnetoresistive element is formed to have the structure illustrated in FIG. 4 and is then manufactured by processing layers under the insulating layer by the known method.

Further, although not illustrated in FIG. 4, transistors for selecting each resistive element or wirings for coupling each element are formed between the Si substrate 201 and the electrode film 202. In addition, there is a case in which the underlayer 203 or the cap layer 207 is not present. As illustrated in FIG. 4, the selection ratio of the insulating layer may be improved and characteristics that can be practically used as the magnetoresistive element may be shown, by inserting the Ta-containing insulating layer 401 between the fixed layer 204 and the free layer 206. The reason will be described with reference to FIGS. 5 and 6.

Figure 5:
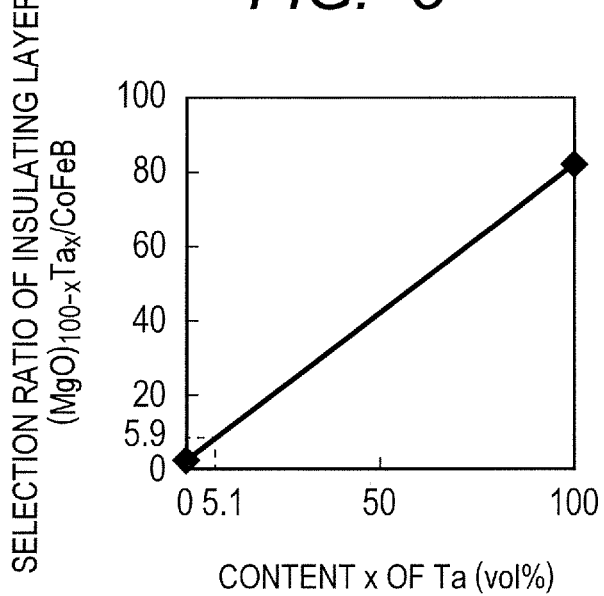
FIG. 5 is a graph illustrating a relationship between the content of Ta of the insulating layer and a selection ratio of the insulating layer to the free layer.

FIG. 5 illustrates dependency of the content of Ta of the selection ratio of the insulating layer to the free layer when the CoFeB is used as the free layer and the Ta-containing insulating layer $(MgO)_{100-x}Ta_x$ in which MgO and Ta are mixed is used as the insulating layer. Further, in FIG. 5, the content of Ta is represented by a volume ratio (vol %) and the selection ratio of the insulating layer is calculated from the results etched under the following etching condition 2 by using an ICP type of plasma source. In addition, since the etching characteristics when several kinds of materials are mixed are in proportion to the volume ratio of the materials, the experiment is performed by setting a content ratio of Ta to be 0 vol % when only the MgO is used as the insulating layer, and the content ratio of Ta to be 100 vol % when only Ta is used as the insulating layer, such that the selection ratio of the insulating layer therebetween is calculated by collinear approximation.

(Etching Condition 2)

CO gas flow rate: 10 ccm, $NH_3$ gas flow rate: 50 ccm, process pressure: 0.3 Pa, source power: 1200 W, wafer bias power: 300 W As illustrated in FIG. 5, when the content ratio of Ta is 100 volt, the selection ratio of the insulating layer represents a value larger than 80. Further, in order to manufacture the magnetoresistive element showing good characteristics on the entire surface of a wafer having a diameter of 300 mm, it is preferable that the selection ratio of the insulating layer is 5.9 or more, but it can be appreciated from FIG. 5 that the selection ratio of the insulating layer can be achieved when the insulating layer contains Ta of 5.1 vol % or more.

Figure 6:
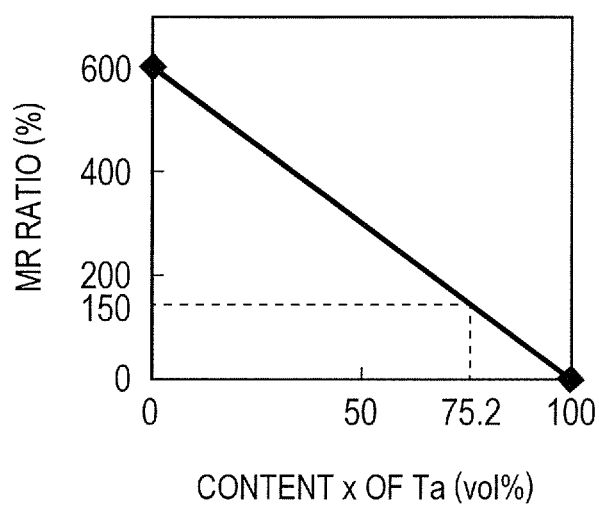
FIG. 6 is a graph illustrating a relationship between the content of Ta of the insulating layer and an MR ratio.

FIG. 6 illustrates dependency of the content of Ta of an MR ratio when the CoFeB is used as the free layer and the $(MgO)_{100-x}Ta_x$ in which MgO and Ta are mixed is used as the insulating layer. In FIG. 6, the content of Ta is represented by the volume ratio (vol %). Further, as the MR ratio having the content of Ta of 0 vol %, the known 604% is used. In addition, when the content of Ta is 100 vol %, the insulating layer is formed of only Ta representing conductive property, and thus loses the function as the insulating layer, such that the MR ratio is set to be 0%. Further, since the magnetic characteristics when several kinds of materials are mixed are in proportion to the volume ratios of the materials, the MR ratios having the content ratio of Ta of 0 vol % and the content ratio of Ta of 100 vol % are calculated by the collinear approximation.

In the recent forecast, realization by 2019 of an element achieving the MR ratio of 150% or more is demanded, and when the MR ratio of 150% or more may be achieved, it may be considered that the realized element can be practically used as the magnetoresistive element. As illustrated in FIG. 6, as the content ratio of Ta is increased, the MR ratio is reduced, but when the content ratio of Ta is 75.2 vol % or less, it can be appreciated that a value larger than the MR ratio of 150% that can be practically used as the magnetoresistive element is obtained.

As described above, it can be appreciated from the results of FIGS. 5 and 6 that the selection ratio of the insulating layer that can manufacture the magnetoresistive element showing good characteristics on the entire surface of the wafer having a diameter of 300 mm achieves 5.9 or more and the MR ratio that can be practically used as the magnetoresistive element achieves 150% or more, by setting the content ratio of Ta to be ranging from 5.1 vol % and 75.2 vol % using the Ta-containing insulating layer $(MgO)_{100-x}Ta_x$ as the insulating layer.

Further, in the results of FIG. 5, the mixed gas of the CO gas and the $NH_3$ gas that are mixed at a 1:5 ratio of $NH_3$ to CO is used, but in the present process, the etching rate of Ta is slower than that of CoFeB by using only the CO gas or only the $NH_3$ gas. In addition, like the mixed gas of the CO gas and the $NH_3$ gas, the etching rate of Ta is slower than that of CoFeB by using the $CH_3OH$ gas. Therefore, when the content ratio of Ta is controlled so as to meet the selection ratio of the insulating layer of 5.9 or more and the MR ratio of 150% or more according to the process conditions, the controlled Ta may be used in the process using the mixed gas of the CO gas and the $NH_3$ gas of which the mixed ratio is changed or the $CH_3OH$ gas.

The embodiment describes the CoFeB as the free layer and the material in which Ta is contained in MgO as the Ta-containing insulating layer, but it is possible to expect the same effect even when other magnetic materials such as NiFe are used as the free layer or even when Ta is contained in another insulating layer of AlO, MgAlO, and the like, instead of MgO. Further, it is possible to expect the same effect even when a Ta-containing material such as TaC, TaS, TaSi, TaN, TaO as well as Ta is mixed in the insulating layer. Therefore, when the selection ratio of the insulating layer meets 5.9 or more and the MR ratio meets 150% or more, the material of the free layer, the material of the insulating layer, or the composition of the Ta-containing material is not particularly limited. However, as the method for manufacturing an insulating layer, a method for forming a film obtained by mixing Mg and a Ta-containing material, a film obtained by mixing Al and a Ta-containing material, or a film obtained by mixing MgAl and a Ta-containing material, and oxidizing the entire surface of the formed film by a plasma oxidation method, an ozone oxidation method, or a radical oxidation method, and the like to manufacture a Ta-containing insulating layer, and then, forming a film such as a free layer on the upper portion of the Ta-containing insulating layer may also be considered. However, since the density of the Ta-containing material is greatly changed due to the oxidation, when the Ta-containing material is oxidized after the formation of the film, the density of the Ta-containing material is suddenly changed due to the oxidation process, such that cracks occur in the insulating layer and the magnetic characteristics greatly deteriorate. Therefore, when manufacturing a Ta-containing insulating layer, the entire surface of the film is oxidized after the formation of the film and then, the film such as the free layer must not be formed on the upper portion thereof. In detail, when the Ta-containing insulating layer is formed, it is preferable to form a film by sputtering a single target obtained by mixing MgO and a Ta-containing material, a single target obtained by mixing AlO and a Ta-containing material, or a single target obtained by mixing MgAlO and a Ta-containing material under the atmosphere of noble gases such as He, Ne, Ar, Kr, Xe, or the like. In addition, the Ta-containing insulating layer may be formed by simultaneously sputtering a plurality of targets by using MgO and a Ta-containing material, AlO and a Ta-containing material, or MgAlO and a Ta-containing material as a separate target. In this case, when one MgO and one Ta-containing material, one AlO and one Ta-containing material, or one MgAlO and one Ta-containing material are used as a target, targets formed of C, Si, and the like may be used simultaneously. Further, when the Ta-containing material is oxidized after the formation of the film, cracks occur in the insulating layer due to the sudden change in density, but when the Ta-containing material is oxidized during the formation of the film, the density is slowly changed to suppress the occurrence of cracks. Therefore, the Ta-containing insulating layer may be formed by sputtering the single target or the plurality of targets of Mg and a Ta-containing material, Al and a Ta-containing material, or MgAl and a Ta-containing material under the atmosphere in which oxygen is contained in the noble gases or the oxygen atmosphere. Further, in order to obtain the desired TaN-containing insulating layer, the TaN-containing insulating layer may be formed by performing the sputtering under the atmosphere in which nitrogen is contained in the noble gases or the nitrogen-containing atmosphere but the film forming atmosphere during the sputtering is not particularly limited.

The process of using the mixed gas of the CO gas and the $NH_3$ gas as described above and the $CH_3OH$ gas reduces the etching rate of the Ti-containing materials such as Ti, TiN, TiAl, TiB, TiC, TiO, TiS, TiSi, and the like, than that of CoFeB. Therefore, when the selection ratio of the insulating layer meets 5.9 or more and the MR ratio meets 150% or more, the Ti-containing material may be used instead of the Ta-containing material.

However, as the method for manufacturing the insulating layer, a method for forming a film by mixing Mg and a Ti-containing material or Al and a Ti-containing material, and oxidizing the entire surface of the formed film by a plasma oxidation method, an ozone oxidation method, or a radical oxidation method, and the like to manufacture the Ti-containing insulating layer, and then, forming a film, such as the free layer on the upper portion of the Ti-containing insulating layer may also be considered. However, the density of the Ti-containing material is greatly changed due to the oxidation, and thus when the Ti-containing material is oxidized after the formation of the film, the density of the Ta-containing material is suddenly changed due to the oxidation process, such that cracks occur in the insulating layer and the magnetic characteristics greatly deteriorate. Therefore, when manufacturing the Ti-containing insulating layer, the entire surface of the film is oxidized after the formation of the film and then, the film, such as the free layer must not be formed on the upper portion thereof. In detail, when the Ti-containing insulating layer is formed, it is preferable to form a film by sputtering a single target obtained by mixing MgO and a Ti-containing material, a single target obtained by mixing AlO and a Ti-containing material, or a single target obtained by mixing MgAlO and a Ti-containing material under the atmosphere of noble gases such as He, Ne, Ar, Kr, Xe, or the like. In addition, the Ti-containing insulating layer may be formed by simultaneously sputtering a plurality of targets by using MgO and a Ti-containing material, AlO and a Ti-containing material, or MgAlO and a Ti content material as a separate target. In this case, when one MgO and one Ti-containing material, one AlO and one Ti-containing material, or one MgAlO and one Ti-containing material are used as a target, targets formed of C, Si, and the like may be used simultaneously. Further, when the Ti-containing material is oxidized after the formation of the film, cracks occur in the insulating layer due to the sudden change in density, but when the Ti-containing material is oxidized during the formation of the film, the density is slowly changed to suppress the occurrence of cracks. Therefore, the Ti-containing insulating layer may be formed by sputtering the single target or the plurality of targets of Mg and a Ta-containing material, Al and a Ti-containing material, or MgAl and a Ti-containing material under the atmosphere in which oxygen is contained in the noble gases or the oxygen atmosphere. In addition, for the same reason, in order to obtain the desired Ti-containing insulating layer, the TiN containing insulating layer may be formed by performing the sputtering under the atmosphere in which nitrogen is contained in the noble gases or the nitrogen-containing atmosphere, but the film forming atmosphere during the sputtering is not particularly limited.

According to the embodiment, it is possible to provide the method for manufacturing a magnetoresistive element having the high selection ratio of the insulating layer to the free layer.

Second Embodiment

A second embodiment according to the present invention will be described with reference to FIGS. 7 and 8. Further, the configurations that are described in the first embodiment but not described in this embodiment can be applied to this embodiment unless the circumstances are exceptional.

Figure 7:
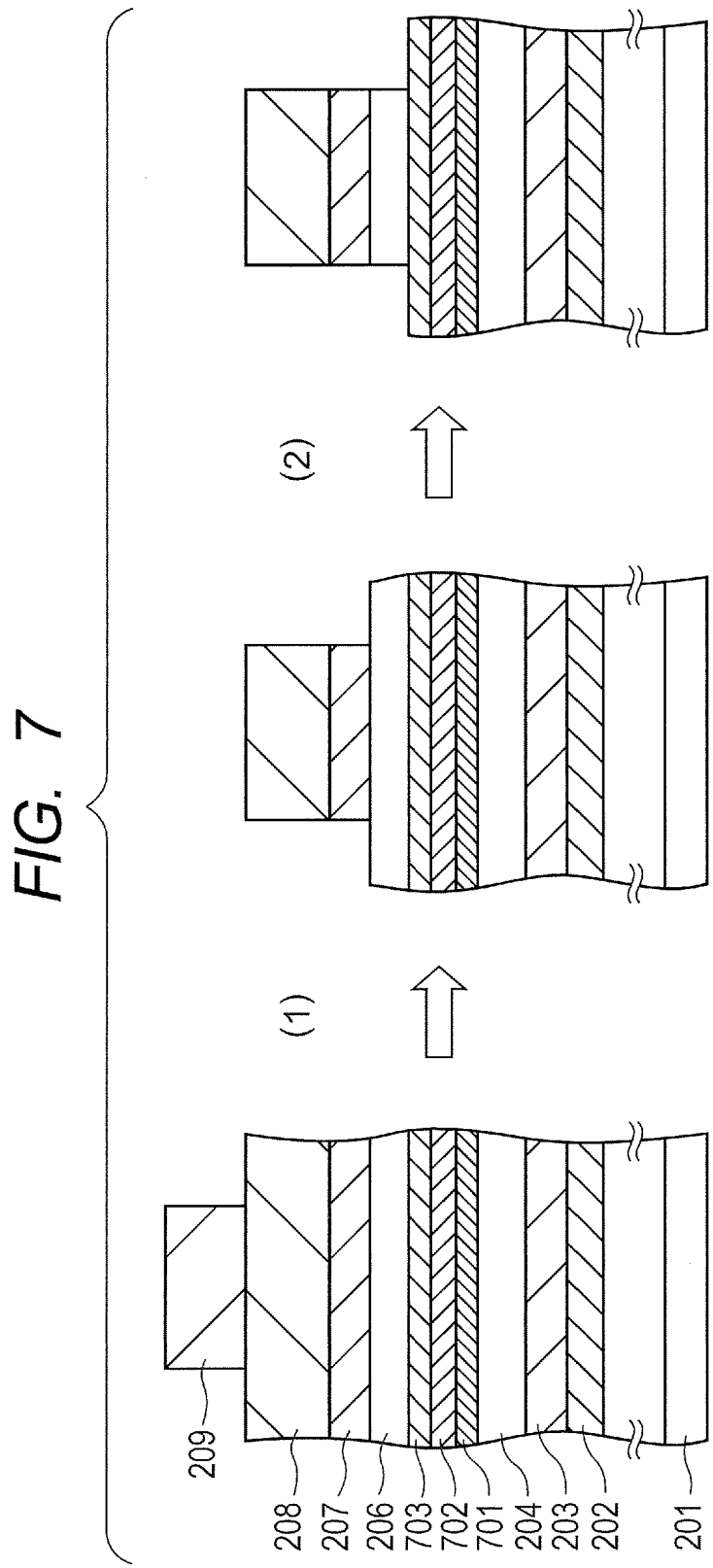
FIG. 7 is a schematic diagram of a magnetoresistive element illustrating a process flow of etching a free layer, in a method of manufacturing a magnetoresistive element according to a second embodiment of the present invention.

FIG. 7 is a schematic diagram of a magnetoresistive element illustrating a process flow of etching a free layer by plasma etching, in a method of manufacturing a magnetoresistive element according to Embodiment 2. In FIG. 7, reference numeral 201 represents a Si substrate, reference numeral 202 represents an electrode film, reference numeral 203 represents an underlayer for controlling crystallinity of a fixed layer or stabilizing a magnetization of the fixed layer, reference numeral 204 represents the fixed layer, reference numeral 701 represents a first insulating layer, reference numeral 702 represents an inter-layer Ta-containing layer, reference numeral 703 represents a second insulating layer, reference numeral 206 represents a free layer, reference numeral 207 represents a cap layer for protecting the free layer, reference numeral 208 represents a hard mask, and reference numeral 209 represents a resist mask, and each layer above the electrode film 202 is sequentially formed on the substrate 201. Alternatively, the substrate on which each layer is formed may be prepared. Although not illustrated in FIG. 7, transistors for selecting each resistive element or wirings for coupling each element are formed between the Si substrate 201 and the electrode film 202. Further, there is a case in which the underlayer 203 or the cap layer 207 is not present. As illustrated in the left drawing of FIG. 7, each layer is formed, the hard mask layer 208 and the cap layer 207 are etched (FIG. 7(1)), and then only the free layer 206 is etched (FIG. 7(2)). The magnetoresistive element is formed to have the structure illustrated in the right drawing of FIG. 7 and is then manufactured by processing layers under the insulating layer by a known method.

Further, the plasma etching is promoted by applying the wafer bias power to the stage, on which the wafer is disposed, to positively attract ions in plasma to the wafer. Herein, when energy of the ions attracted to the wafer is relatively high, the etching is performed on a etched surface, and at the same time, a plurality of ions are also attracted to the etched surface, and elements of a layer under the etched surface are diffused to an upper layer thereof by the attracted ions. In particular, the process having high ion energy is used during the process of etching the free layer 206 that is a magnetic material shown in FIG. 7, such that the diffusion of elements are promoted. Therefore, in the process (2) shown in FIG. 7, on the processed surface of which the upper layer is not formed with the hard mask 208, the inter-layer Ta-containing layer 702 is diffused to the second insulating layer 703 by the energy of irradiated ions. FIG. 8 schematically illustrates the state.

Figure 8:
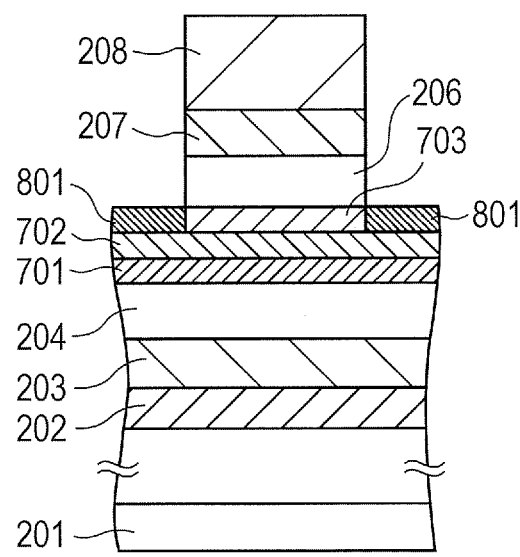
FIG. 8 is a schematic diagram for describing an effect in the method of manufacturing a magnetoresistive element according to the second embodiment of the present invention.

As illustrated in FIG. 8, a Ta-containing insulating layer 801 is formed on the processed surface by diffusing the inter-layer Ta-containing layer 702 to the second insulating layer 703. In the step of FIG. 7(2), in the case of using the process of using the $NH_3$ gas, the mixed gas of the CO gas and the $NH_3$ gas, or the $CH_3OH$ gas, the selection ratio of the insulating layer is increased when Ta is contained in the insulating layer, such that the selection ratio of the insulating layer is improved only on the processed surface by the formation of the Ta-containing insulating layer 801. By doing so, it is possible to achieve the selection ratio of the insulating layer of 5.9 or more that can manufacture the magnetoresistive element showing the good characteristics on the entire surface of the wafer having a diameter of 300 mm.

Further, an amount of Ta diffused from the Ta-containing layer 702 is increased further at a thinner side of the second insulating layer, such that the selection ratio of the insulating layer is increased. Therefore, Even though the selection ratio of the insulating layer is insufficient in a part inside the wafer surface, and thus the etching of the second insulating layer is performed, the selection ratio of the insulating layer is increased according to the reduction in the film thickness and thus it is possible to achieve the selection ratio of the insulating layer of 5.9 or more during the etching of the second insulating layer. By doing so, it is possible to manufacture the magnetoresistive element showing the good characteristics on the entire surface of the wafer having a diameter of 300 mm by preventing the characteristics of the magnetoresistive element from deteriorating due to the penetration of a part of the insulating layer just under the free layer.

In FIGS. 7 and 8, the magnetoresistive element has a structure in which the Ta-containing layer 702 is interposed between the first insulating layer 701 and the second insulating layer 703, but if not specifically required, the first insulating layer 701 may be removed. However, when not contacting the first insulating layer 701, the magnetic characteristics of a pin layer (fixed layer) 204 are likely to deteriorate, such that it is preferable to insert the first insulating layer 701. Further, in FIGS. 7 and 8, one Ta-containing layer is inserted between two insulating layers, but when the Ta-containing layer is formed just under the insulating layer, the number of Ta-containing layers is not particularly limited. That is, three insulating layers are formed and a total of two Ta-containing layers may be formed between the three insulating layers one by one. However, when the total of film thickness of all the insulating layers and the Ta-containing layers is larger than 3 nm, the MR ratio is considerably reduced such that the MR ratio of 150% or more that can be practically used as the magnetoresistive element may not be achieved. As a result, the total of film thickness of all the insulating layers and the Ta-containing layers is preferably set to a finite value less than 3 nm. Further, when the thickness of one Ta-containing layer is less than 0.1 nm, the Ta-containing layer has an island shape, such that it is difficult to keep the Ta-containing layer as one film. As a result, it is preferable to set the thickness of one Ta-containing layer to be 0.1 nm or more. In addition, the Ta-containing layer may be formed by containing only Ta, but the composition thereof is not particularly limited if the Ta-containing layer is a mixed part containing a Ta element, such as TaC, TaS, TaSi, TaN, and TaO.

Further, the process of using the mixed gas of the CO gas and the $NH_3$ gas and the $CH_3OH$ gas as described above reduces the etching rate of the Ti-containing material such as Ti, TiN, TiAl, TiB, TiC, TiO, TiS, TiSi, and the like, than that of the free layer. Therefore, when the selection ratio of the insulating layer meets 5.9 or more and the MR ratio meets 150% or more, the Ti-containing material may be used instead of the Ta-containing material.

According to the embodiment, it is possible to provide the method for manufacturing a magnetoresistive element having the high selection ratio of the insulating layer to the free layer.

As described above, the present invention has been described in detail, but the main aspects of the present invention will be listed below.

(1) In a magnetoresistive element having a multi-layer film structure including a free layer that is a magnetic layer of which the magnetization direction can be inverted by external magnetic field or spin injection, a fixed layer that is a magnetic layer of which the magnetization direction is not inverted by external magnetic field or spin injection, and an insulating layer interposed between the free layer and the fixed layer, the insulating layer is configured as a Ta-containing insulating layer.

(2) In the magnetoresistive element described in (1), the Ta-containing insulating layer is formed of the mixed material of MgO and Ta and a ratio of Ta occupied within the Ta-containing layer is ranging from 5.1 vol % to 75.2 vol %.

(3) In a magnetoresistive element having a multi-layer film structure including a free layer that is a magnetic layer of which the magnetization direction can be inverted by external magnetic field or spin injection, a fixed layer that is a magnetic layer of which the magnetization direction is not inverted by external magnetic field or spin injection, and an insulating layer interposed between the free layer and the fixed layer, the insulating layer is configured as a Ti-containing insulating layer.

(4) In the magnetoresistive element having a multi-layer film structure including a free layer that is a magnetic layer of which the magnetization direction can be inverted by external magnetic field or spin injection and a fixed layer that is a magnetic layer of which the magnetization direction is not inverted by external magnetic field or spin injection, a Ta-containing layer interposed between two insulating layers is inserted between the fixed layer and the free layer.

(5) In the magnetoresistive element having a multi-layer film structure including a free layer that is a magnetic layer of which the magnetization direction can be inverted by external magnetic field or spin injection and a fixed layer that is a magnetic layer of which the magnetization direction is not inverted by external magnetic field or spin injection, a Ta layer interposed between two MgO layers is inserted between the fixed layer and the free layer.

(6) In the magnetoresistive element having a multi-layer film structure including a free layer that is a magnetic layer of which the magnetization direction can be inverted by external magnetic field or spin injection and a fixed layer that is a magnetic layer of which the magnetization direction is not inverted by external magnetic field or spin injection, a Ti-containing layer interposed between two insulating layers is inserted between the fixed layer and the free layer.

(7) In a method for manufacturing a magnetoresistive element described in (1) to (6), the free layer is processed by plasma etching using $NH_3$ gas, CO gas, a mixed gas of the $NH_3$ gas and the CO gas, or $CH_3OH$ gas.

According to the present invention, it is possible to manufacture the magnetoresistive element which can increase the selection ratio of the insulating layer to the free layer and shows the good characteristics on the entire surface of the wafer when the free layer of the magnetoresistive element is etched, by using the Ta-containing layer containing Ta or the Ti-containing layer containing Ti as the insulating layer of the magnetoresistive element.

Further, it is possible to manufacture the magnetoresistive element which can increase the selection ratio of the insulating layer to the free layer and shows the good characteristics on the entire surface of the wafer, by inserting the Ta-containing layer or the Ti-containing layer, which is interposed between the two insulating layers, between the fixed layer and the free layer.

Further, the present invention is not limited to the foregoing embodiments, but includes various modifications. For example, the foregoing embodiments are described in detail for easily describing the present invention, and are not essentially limited as those including all components that are described above. In addition, some of the configurations of any embodiment can be substituted into configurations of other embodiments and configurations of other embodiments can be added to the configuration of any embodiment. Furthermore, for some of the configurations of each embodiment, other configurations can be added, deleted and substituted.

What is claimed is:

1. A method for manufacturing a magnetoresistive element comprising the steps of:
   forming a second magnetic layer over a substrate;
   forming a barrier layer that is an insulating layer, which is a Ta-containing insulating layer in which MgO and Ta are mixed, on the second magnetic layer by sputtering an insulating material target and a Ta-containing material target;
   forming a first magnetic layer on the barrier layer; and
   processing the first magnetic layer by plasma etching,
   wherein a content ratio of a Ta element to the barrier layer is in a range in which
      an MR ratio is 150% or more,
      MR ratio=$\{(Rap-Rp)/Rp\} \times 100(\%)$ where Rp is electric resistance between the first magnetic layer and the second magnetic layer when magnetization directions of the first magnetic layer and the second magnetic layer are parallel with each other and Rap is the electric resistance between the first magnetic layer and the second magnetic layer when the magnetization directions of the first magnetic layer and the second magnetic layer are antiparallel with each other.

2. The method for manufacturing a magnetoresistive element according to claim 1, wherein the insulating material target is a MgO target, an AlO target, or a MgAlO target.

3. The method for manufacturing a magnetoresistive element according to claim 1,
   wherein the first magnetic layer is a free layer of which the magnetization direction is inverted by external magnetic field or spin injection, and the second magnetic layer is a fixed layer of which the magnetization direction is not inverted by external magnetic field or spin injection.

4. The method for manufacturing a magnetoresistive element according to claim 1, wherein a content ratio of the Ta element to the Ta-containing insulating layer ranges from 5.1 vol % to 75.2 vol %.

5. The method for manufacturing a magnetoresistive element according to claim 1, wherein the Ta-containing insulating layer is an insulating layer represented by $(MgO)_{100-x}Ta_x$.

6. The method for manufacturing a magnetoresistive element according to claim 1, wherein the barrier layer includes a plurality of laminated insulating films.

7. The method for manufacturing a magnetoresistive element according to claim 1, wherein a thickness of the barrier layer has a finite value less than 3 nm.

8. The method for manufacturing a magnetoresistive element according to claim 1, wherein in the processing of the first magnetic layer by the plasma etching, any one of NH3 gas, CO gas, the mixed gas of NH3 gas and CO gas, and CH3OH gas is used.

9. The method for manufacturing a magnetoresistive element according to claim 1, wherein the Ta-containing insulating layer is formed by sputtering a target comprising MgO and a target comprising Ta.

10. The method for manufacturing a magnetoresistive element according to claim 1, wherein the first magnetic layer comprises CoFeB, and the Ta-containing insulating layer is represented by $(MgO)_{100-x}Ta_x$.

11. A method for manufacturing a magnetoresistive element comprising the steps of:
    forming a second magnetic layer over a substrate;
    forming a barrier layer that is an insulating layer including a Ta element or a Ti element on the second magnetic layer by sputtering an insulating material target, and a Ta-containing material target or a Ti-containing material target;
    forming a first magnetic layer on the barrier layer; and
    processing the first magnetic layer by plasma etching,
    wherein a content ratio of the Ta element or the Ti element to the barrier layer is in a range in which
    an MR ration is 150% or more,
    MR ratio=$\{(Rap-Rp)/Rp\}\times100(\%)$ where Rp is electric resistance between the first magnetic layer and the second magnetic layer when magnetization directions of the first magnetic layer and the second magnetic layer are parallel with each other and Rap is the electric resistance between the first magnetic layer and the second magnetic layer when the magnetization directions of the first magnetic layer and the second magnetic layer are antiparallel with each other.

* * * * *